US007058862B2

(12) United States Patent
Whetsel et al.

(10) Patent No.: US 7,058,862 B2
(45) Date of Patent: Jun. 6, 2006

(54) SELECTING DIFFERENT 1149.1 TAP DOMAINS FROM UPDATE-IR STATE

(75) Inventors: Lee D. Whetsel, Allen, TX (US); Baher S. Haroun, Allen, TX (US); Brian J. Lasher, Bellaire, TX (US); Anjali Kinra, Stafford, TX (US)

(73) Assignee: Texas Instruments Incorporated, Dallas, TX (US)

( * ) Notice: Subject to any disclaimer, the term of this patent is extended or adjusted under 35 U.S.C. 154(b) by 711 days.

(21) Appl. No.: 09/864,509

(22) Filed: May 24, 2001

(65) Prior Publication Data

US 2002/0049928 A1 Apr. 25, 2002

Related U.S. Application Data

(60) Provisional application No. 60/207,691, filed on May 26, 2000.

(51) Int. Cl.
*G01R 31/28* (2006.01)

(52) U.S. Cl. ...................................... 714/247
(58) Field of Classification Search ............. 714/724, 714/726, 727, 733, 27–30; 326/16
See application file for complete search history.

(56) References Cited

U.S. PATENT DOCUMENTS

| 3,633,100 A | 1/1972 | Heilweil et al. ............... 324/73 |
| 3,651,315 A | 3/1972 | Collins ................... 235/151.31 |
| 3,657,527 A | 4/1972 | Kassabgi et al. ........... 235/153 |
| 3,723,868 A | 3/1973 | Foster ..................... 324/73 AT |
| 3,739,193 A | 6/1973 | Pryor .......................... 307/205 |
| 3,789,359 A | 1/1974 | Clark, Jr. et al. ..... 340/146.1 D |
| 3,824,678 A | 7/1974 | Harris et al. .................. 29/578 |
| 3,826,909 A | 7/1974 | Ivashin ................. 235/153 AC |
| 3,831,149 A | 8/1974 | Job .......................... 340/172.5 |

(Continued)

FOREIGN PATENT DOCUMENTS

EP 0136174 4/1985

(Continued)

OTHER PUBLICATIONS

"Hierarchical Test Access Architecture for Embedded Cores in an Integrated Circuit" by Bhattacharya, D. VLSI Test Symposium Proceedings, Publication Date: Apr. 26-30, 1998 pp. 8-14 Inspec Accession No. 6039765.*

(Continued)

*Primary Examiner*—Guy Lamarre
*Assistant Examiner*—Cynthia Britt
(74) *Attorney, Agent, or Firm*—Lawrence J. Bassuk; W. James Brady; Frederick J. Telecky, Jr.

(57) ABSTRACT

IEEE 1149.1 Test Access Ports (TAPs) may be utilized at both IC and intellectual property core design levels. TAPs serve as serial communication ports for accessing a variety of embedded circuitry within ICs and cores including; IEEE 1149.1 boundary scan circuitry, built in test circuitry, internal scan circuitry, IEEE 1149.4 mixed signal test circuitry, IEEE P5001 in-circuit emulation circuitry, and IEEE P1532 in-system programming circuitry. Selectable access to TAPs within ICs is desirable since in many instances being able to access only the desired TAP(s) leads to improvements in the way testing, emulation, and programming may be performed within an IC. A TAP linking module is described that allows TAPs embedded within an IC to be selectively accessed using 1149.1 instruction scan operations.

5 Claims, 5 Drawing Sheets

U.S. PATENT DOCUMENTS

| | | | |
|---|---|---|---|
| 3,838,264 A | 9/1974 | Maker | 235/153 AM |
| 3,873,818 A | 3/1975 | Barnard | 253/153 AC |
| 3,976,940 A | 8/1976 | Chau et al. | 324/73 R |
| 4,023,142 A | 5/1977 | Woessner | 340/172.5 |
| 4,066,882 A | 1/1978 | Esposito | 235/302 |
| 4,086,375 A | 4/1978 | LaChapelle, Jr. et al. | 427/90 |
| 4,092,733 A | 5/1978 | Coontz et al. | 365/200 |
| 4,108,359 A | 8/1978 | Proto | 235/304 |
| 4,146,835 A | 3/1979 | Chnapko et al. | 324/73 R |
| 4,161,276 A | 7/1979 | Sacher et al. | 235/302 |
| 4,216,539 A | 8/1980 | Raymond et al. | 371/20 |
| 4,242,751 A | 12/1980 | Henckels et al. | 371/26 |
| 4,264,807 A | 4/1981 | Moen et al. | 235/92 GD |
| 4,268,902 A | 5/1981 | Berglund et al. | 364/200 |
| 4,286,173 A | 8/1981 | Oka et al. | 307/440 |
| 4,308,616 A | 12/1981 | Timoc | 371/23 |
| 4,309,767 A | 1/1982 | Andow et al. | 371/24 |
| 4,312,066 A | 1/1982 | Bantz et al. | 371/16 |
| 4,339,710 A | 7/1982 | Hapke | 324/73 R |
| RE31,056 E | 10/1982 | Chau et al. | 324/73 R |
| 4,357,703 A | 11/1982 | Van Brunt | 371/25 |
| 4,365,334 A | 12/1982 | Smith et al. | 371/27 |
| 4,366,478 A | 12/1982 | Masuda et al. | 340/825 |
| 4,390,969 A | 6/1983 | Hayes | 395/550 |
| 4,426,697 A | 1/1984 | Petersen et al. | 340/825.52 |
| 4,433,413 A | 2/1984 | Fasang | 371/25 |
| 4,439,858 A | 3/1984 | Petersen | 371/20 |
| 4,441,075 A | 4/1984 | McMahon | 324/73 R |
| 4,483,002 A | 11/1984 | Groom, Jr. et al. | 371/29 |
| 4,484,329 A | 11/1984 | Slamka et al. | 371/25 |
| 4,488,259 A | 12/1984 | Mercy | 364/900 |
| 4,493,077 A | 1/1985 | Agrawal et al. | 371/25 |
| 4,494,066 A | 1/1985 | Goel et al. | 324/73 R |
| 4,498,172 A | 2/1985 | Bhavsar | 371/25 |
| 4,503,536 A | 3/1985 | Panzer | 371/25 |
| 4,504,784 A | 3/1985 | Goel et al. | 324/73 R |
| 4,513,373 A | 4/1985 | Sheets | 364/200 |
| 4,513,418 A | 4/1985 | Bardell, Jr. et al. | 371/25 |
| 4,514,845 A | 4/1985 | Starr | 371/15 |
| 4,519,078 A | 5/1985 | Komonytshy | 371/25 |
| 4,534,028 A | 8/1985 | Trischler | 371/25 |
| 4,553,090 A | 11/1985 | Hatano et al. | 324/73 AT |
| 4,575,674 A | 3/1986 | Bass et al. | 324/73 R |
| 4,577,318 A | 3/1986 | Whitacre et al. | 371/1 |
| 4,587,609 A | 5/1986 | Boudreau et al. | 395/726 |
| 4,594,711 A | 6/1986 | Thatte | 371/25 |
| 4,597,042 A | 6/1986 | d'Angeac | 364/200 |
| 4,597,080 A | 6/1986 | Thatte et al. | 371/25 |
| 4,598,401 A | 7/1986 | Whelan | 371/25 |
| 4,601,034 A | 7/1986 | Sridhar | 371/25 |
| 4,602,210 A | 7/1986 | Fasang et al. | 324/73 |
| 4,612,499 A | 9/1986 | Andresen et al. | 324/73 R |
| 4,615,029 A | 9/1986 | Hu et al. | 370/89 |
| 4,618,956 A | 10/1986 | Horst | 371/68 |
| 4,620,302 A | 10/1986 | Binoeder et al. | 371/1 |
| 4,621,363 A | 11/1986 | Blum | 371/25 |
| 4,627,018 A | 12/1986 | Trost et al. | 395/476 |
| 4,628,511 A | 12/1986 | Stitzlein et al. | 371/22 |
| 4,635,193 A | 1/1987 | Moyer et al. | 364/200 |
| 4,635,261 A | 1/1987 | Anderson et al. | 371/25 |
| 4,638,313 A | 1/1987 | Sherwood et al. | 340/825.52 |
| 4,642,561 A | 2/1987 | Groves et al. | 324/73 R |
| 4,646,298 A | 2/1987 | Laws et al. | 371/16 |
| 4,646,299 A | 2/1987 | Schinabeck et al. | 371/20 |
| 4,651,088 A | 3/1987 | Sawada | 324/73 R |
| 4,669,061 A | 5/1987 | Bhavsar | 365/154 |
| 4,672,307 A | 6/1987 | Breuer et al. | 324/73 R |
| 4,674,089 A | 6/1987 | Poret et al. | 371/25 |
| 4,679,192 A | 7/1987 | Vanbrabant | 340/825.52 |
| 4,680,539 A | 7/1987 | Tsai | 324/73 |
| 4,680,733 A | 7/1987 | Duforestel | 364/900 |
| 4,683,569 A | 7/1987 | Rubin | 371/25 |
| 4,687,988 A | 8/1987 | Eichelberger et al. | 324/73 AT |
| 4,694,293 A | 9/1987 | Sugiyama et al. | 340/825.68 |
| 4,698,588 A | 10/1987 | Hwang et al. | 324/73 R |
| 4,701,916 A | 10/1987 | Naven et al. | 371/15 |
| 4,701,920 A | 10/1987 | Resnick et al. | 371/25 |
| 4,701,921 A | 10/1987 | Powell et al. | 371/25 |
| 4,710,931 A | 12/1987 | Bellay et al. | 371/25 |
| 4,710,932 A | 12/1987 | Hiroshi | 371/25 |
| 4,710,933 A | 12/1987 | Powell et al. | 371/25 |
| 4,734,921 A | 3/1988 | Giangano et al. | 377/72 |
| 4,740,970 A | 4/1988 | Burrows et al. | 371/15 |
| 4,743,841 A | 5/1988 | Takeuchi | 324/73 R |
| 4,745,355 A | 5/1988 | Eichelberger et al. | 324/73 R |
| 4,752,929 A | 6/1988 | Kantz et al. | 371/21 |
| 4,759,019 A | 7/1988 | Bentley et al. | 371/3 |
| 4,763,066 A | 8/1988 | Yeung et al. | 324/73 R |
| 4,764,926 A | 8/1988 | Knight et al. | 371/25 |
| 4,777,616 A | 10/1988 | Moore et al. | 364/900 |
| 4,783,785 A | 11/1988 | Hanta | 371/25 |
| 4,788,683 A | 11/1988 | Hester et al. | 371/20 |
| 4,791,358 A | 12/1988 | Sauerwald et al. | 324/73 R |
| 4,799,004 A | 1/1989 | Mori | 324/73 R |
| 4,799,052 A | 1/1989 | Near et al. | 340/825.52 |
| 4,800,418 A | 1/1989 | Natsui | 357/68 |
| 4,801,870 A | 1/1989 | Eichelberger et al. | 324/73 R |
| 4,802,163 A | 1/1989 | Hirabayshi | 371/15 |
| 4,808,844 A | 2/1989 | Ozaki et al. | 307/243 |
| 4,811,299 A | 3/1989 | Miyazawa et al. | 365/201 |
| 4,812,678 A | 3/1989 | Abe | 307/443 |
| 4,817,093 A | 3/1989 | Jacobs et al. | 371/25 |
| 4,819,234 A | 4/1989 | Huber | 371/19 |
| 4,821,269 A | 4/1989 | Jackson et al. | 371/16 |
| 4,825,439 A | 4/1989 | Sakashita et al. | 371/15 |
| 4,833,395 A | 5/1989 | Sasaki et al. | 324/73 R |
| 4,833,676 A | 5/1989 | Koo | 371/15 |
| 4,855,954 A | 8/1989 | Turner et al. | 365/185 |
| 4,857,835 A | 8/1989 | Whetsel | 324/73 |
| 4,860,288 A | 8/1989 | Teske et al. | 371/1 |
| 4,860,290 A | 8/1989 | Daniels et al. | 371/25 |
| 4,862,071 A | 8/1989 | Sato et al. | 324/73 R |
| 4,862,072 A | 8/1989 | Harris et al. | 324/73 R |
| 4,864,570 A | 9/1989 | Savaglio et al. | 371/22.4 |
| 4,864,579 A | 9/1989 | Kishida et al. | 371/22.3 |
| 4,866,508 A | 9/1989 | Eichelberger et al. | 357/74 |
| 4,870,345 A | 9/1989 | Tomioka et al. | 371/22.3 |
| 4,872,169 A | 10/1989 | Whetsel | 371/22.3 |
| 4,875,003 A | 10/1989 | Burke | 324/73 R |
| 4,878,168 A | 10/1989 | Johnson et al. | 364/200 |
| 4,879,717 A | 11/1989 | Sauerwald et al. | 371/22.3 |
| 4,887,262 A | 12/1989 | van Veldhuizen | 370/85.1 |
| 4,887,267 A | 12/1989 | Kanuma | 371/22.3 |
| 4,893,072 A | 1/1990 | Matsumoto | 371/223 |
| 4,894,830 A | 1/1990 | Kawai | 371/22.3 |
| 4,896,262 A | 1/1990 | Wayama et al. | 364/200 |
| 4,897,842 A | 1/1990 | Herz et al. | 371/22.4 |
| 4,899,273 A | 2/1990 | Omoda et al. | 364/200 |
| 4,903,266 A | 2/1990 | Hack | 371/21.2 |
| 4,907,230 A | 3/1990 | Heller et al. | 371/22.1 |
| 4,910,735 A | 3/1990 | Yamashita | 371/22.4 |
| 4,912,633 A | 3/1990 | Schweizer et al. | 364/200 |
| 4,912,709 A | 3/1990 | Teske et al. | 371/22.1 |
| 4,918,379 A | 4/1990 | Jongepier | 324/73.1 |
| 4,924,468 A | 5/1990 | Horak et al. | 371/22.1 |
| 4,926,425 A | 5/1990 | Hedtke et al. | 371/22.6 |
| 4,929,889 A | 5/1990 | Seiler et al. | 371/22.3 |
| 4,930,216 A | 6/1990 | Nelson | 29/854 |
| 4,931,722 A | 6/1990 | Stoica | 371/22.5 |
| 4,931,723 A | 6/1990 | Jeffrey et al. | 371/22.3 |
| 4,935,868 A | 6/1990 | DuLac | 364/200 |
| 4,937,826 A | 6/1990 | Gheewala et al. | 371/22.1 |
| 4,943,966 A | 7/1990 | Giunta et al. | 371/11.1 |
| 4,945,536 A | 7/1990 | Hancu | 371/22.3 |

| | | | | | | | |
|---|---|---|---|---|---|---|---|
| 4,947,106 A | 8/1990 | Chism | 324/73.1 | 5,297,277 A | 3/1994 | Dein et al. | 395/575 |
| 4,947,357 A | 8/1990 | Stewart et al. | 371/22.3 | 5,303,148 A | 4/1994 | Mattson et al. | 364/413.01 |
| 4,956,602 A | 9/1990 | Parrish | 324/158 R | 5,313,158 A | 5/1994 | Joosten et al. | 324/158 R |
| 4,961,053 A | 10/1990 | Krug | 324/158 R | 5,315,241 A | 5/1994 | Ewers | 324/158 R |
| 4,969,121 A | 11/1990 | Chan et al. | 364/900 | 5,317,205 A | 5/1994 | Sato | 307/443 |
| 4,974,192 A | 11/1990 | Face et al. | 364/900 | 5,319,754 A | 6/1994 | Meinecke et al. | 395/325 |
| 4,974,226 A | 11/1990 | Fujimori et al. | 371/22.3 | 5,321,322 A | 6/1994 | Verheyen et al. | 307/465.1 |
| 4,989,209 A | 1/1991 | Littlebury et al. | 371/22.1 | 5,323,107 A | 6/1994 | D'Souza | 324/754 |
| 4,992,985 A | 2/1991 | Miyazawa et al. | 365/201 | 5,329,471 A | 7/1994 | Swoboda et al. | 364/578 |
| 5,001,713 A | 3/1991 | Whetsel | 371/22.3 | 5,334,857 A | 8/1994 | Mennitt et al. | 257/48 |
| 5,008,618 A | 4/1991 | Van Der Star | 324/158 R | 5,343,478 A | 8/1994 | James et al. | 371/22.3 |
| 5,008,885 A | 4/1991 | Huang et al. | 371/3 | 5,353,308 A | 10/1994 | Whetsel | 371/22.3 |
| 5,012,185 A | 4/1991 | Ohfuji | 324/158 R | 5,355,369 A | 10/1994 | Greenberger et al. | 371/22.3 |
| 5,014,186 A | 5/1991 | Chisholm | 395/850 | 5,366,906 A | 11/1994 | Wojnarowski et al. | 437/8 |
| 5,023,872 A | 6/1991 | Annamalai | 371/5.1 | 5,371,390 A | 12/1994 | Mohsen | 257/209 |
| 5,042,005 A | 8/1991 | Miller et al. | 364/900 | 5,377,198 A | 12/1994 | Simpson et al. | 371/22.3 |
| 5,048,021 A | 9/1991 | Jarwala et al. | 371/22.3 | 5,388,216 A | 2/1995 | Oh | 395/849 |
| 5,051,996 A | 9/1991 | Bergeson et al. | 371/22.4 | 5,389,556 A | 2/1995 | Rostoker et al. | 437/8 |
| 5,053,949 A | 10/1991 | Allison et al. | 364/200 | 5,389,873 A | 2/1995 | Ishii et al. | 324/158.1 |
| 5,054,024 A | 10/1991 | Whetsel | 371/22.3 | 5,390,131 A | 2/1995 | Rohrbaugh et al. | 364/490 |
| 5,056,093 A | 10/1991 | Whetsel | 371/22.3 | 5,391,984 A | 2/1995 | Worley | 324/158.1 |
| 5,056,094 A | 10/1991 | Whetsel | 371/25.1 | 5,396,170 A | 3/1995 | D'Souza et al. | 324/158.1 |
| 5,070,296 A | 12/1991 | Priebe | 324/73.1 | 5,399,505 A | 3/1995 | Dasse et al. | 437/8 |
| 5,070,297 A | 12/1991 | Kwon et al. | 324/158 P | 5,420,874 A | 5/1995 | Kromer | 371/47.1 |
| 5,077,740 A | 12/1991 | Kanuma | 371/22.3 | 5,424,651 A | 6/1995 | Green et al. | 324/754 |
| 5,084,814 A | 1/1992 | Vaglica et al. | 395/325 | 5,426,650 A | 6/1995 | Ganapathy et al. | 371/22.3 |
| 5,084,874 A | 1/1992 | Whetsel | 371/22.3 | 5,428,622 A | 6/1995 | Kuban et al. | 371/22.3 |
| 5,090,015 A | 2/1992 | Dabbish et al. | 371/22.5 | 5,430,735 A | 7/1995 | Sauerwald et al. | 371/22.3 |
| 5,090,035 A | 2/1992 | Murase | 377/72 | 5,434,804 A | 7/1995 | Bock et al. | 364/579 |
| 5,103,450 A | 4/1992 | Whetsel | 714/724 | 5,442,282 A | 8/1995 | Rostoker et al. | 324/158.1 |
| 5,107,148 A | 4/1992 | Millman | 307/473 | 5,446,395 A | 8/1995 | Goto | 324/763 |
| 5,107,489 A | 4/1992 | Brown et al. | 370/58.2 | 5,448,166 A | 9/1995 | Parker et al. | 324/158 |
| 5,109,190 A | 4/1992 | Sahashita et al. | 324/158 R | 5,448,525 A | 9/1995 | Sturges | 365/201 |
| 5,109,383 A | 4/1992 | Chujo | 371/22.3 | 5,448,576 A | 9/1995 | Russell | 371/22.3 |
| 5,115,191 A | 5/1992 | Yoshimori | 324/158 R | 5,450,415 A | 9/1995 | Kamada | 371/22.3 |
| 5,115,435 A | 5/1992 | Langford, II et al. | 371/22.1 | 5,453,992 A | 9/1995 | Whetsel | 371/22.3 |
| 5,126,286 A | 6/1992 | Chance | 437/203 | 5,457,400 A | 10/1995 | Ahmad et al. | 324/763 |
| 5,128,664 A | 7/1992 | Bishop | 340/825.52 | 5,469,473 A | 11/1995 | McClear et al. | 375/219 |
| 5,130,988 A | 7/1992 | Wilcox et al. | 371/22.3 | 5,471,481 A | 11/1995 | Okumoto et al. | 371/22.3 |
| 5,132,635 A | 7/1992 | Kennedy | 371/22.3 | 5,481,734 A | 1/1996 | Yoshida | 395/775 |
| 5,133,062 A | 7/1992 | Joshi et al. | 395/500 | 5,483,518 A | 1/1996 | Whetsel | 370/13 |
| 5,134,314 A | 7/1992 | Wehrmacher | 307/443 | 5,488,614 A | 1/1996 | Shima | 371/22.3 |
| 5,150,044 A | 9/1992 | Hashizume et al. | 324/158 R | 5,488,728 A | 1/1996 | Dreyer | 395/726 |
| 5,150,047 A | 9/1992 | Saito et al. | 324/158 R | 5,489,538 A | 2/1996 | Rostoker et al. | 437/8 |
| 5,155,432 A | 10/1992 | Mahoney | 324/158 R | 5,490,151 A | 2/1996 | Feger et al. | 371/22.3 |
| 5,159,465 A | 10/1992 | Maemura et al. | 326/73 | 5,491,666 A | 2/1996 | Sturges | 365/201 |
| 5,161,160 A | 11/1992 | Yaguchi et al. | 371/22.3 | 5,491,699 A | 2/1996 | Scheuermann et al. | 371/22.1 |
| 5,165,022 A | 11/1992 | Erhard et al. | 395/275 | 5,495,487 A | 2/1996 | Whetsel | 714/736 |
| 5,167,020 A | 11/1992 | Kahn et al. | 395/250 | 5,497,378 A | 3/1996 | Amini et al. | 714/727 |
| 5,170,398 A | 12/1992 | Fujieda et al. | 371/27 | 5,526,310 A | 6/1996 | Dondale | 365/196 |
| 5,172,377 A | 12/1992 | Robinson et al. | 371/22.3 | 5,526,365 A | 6/1996 | Whetsel | 371/22.3 |
| 5,173,906 A | 12/1992 | Dreibelbis et al. | 371/22.5 | 5,532,174 A | 7/1996 | Corrigan | 437/8 |
| 5,175,447 A | 12/1992 | Kawasaki et al. | 307/480 | 5,534,786 A | 7/1996 | Kaneko et al. | 324/760 |
| 5,187,795 A | 2/1993 | Balmforth et al. | 395/800 | 5,535,222 A | 7/1996 | Le | 371/22 |
| 5,191,653 A | 3/1993 | Banks et al. | 395/275 | 5,535,331 A | 7/1996 | Swoboda et al. | 714/28 |
| 5,202,625 A | 4/1993 | Farwell | 324/158 R | 5,541,935 A | 7/1996 | Waterson | 371/22.5 |
| 5,206,545 A | 4/1993 | Huang | 307/443 | 5,544,174 A | 8/1996 | Abend | 371/22.3 |
| 5,210,759 A | 5/1993 | DeWitt et al. | 371/22.3 | 5,548,781 A | 8/1996 | Huang | 395/831 |
| 5,214,760 A | 5/1993 | Hammond et al. | 395/250 | 5,550,843 A | 8/1996 | Yee | 371/22.3 |
| 5,214,774 A | 5/1993 | Welsch et al. | 455/11.1 | 5,557,573 A | 9/1996 | McClure | 365/201 |
| 5,218,702 A | 6/1993 | Kirtland | 395/298 | 5,568,492 A | 10/1996 | Flint et al. | 371/22.1 |
| 5,222,068 A | 6/1993 | Burchard | 371/22.3 | 5,568,493 A | 10/1996 | Morris | 324/73 |
| 5,241,265 A | 8/1993 | McDonnell et al. | 324/158 R | 5,574,730 A | 11/1996 | End, III et al. | 714/724 |
| 5,241,266 A | 8/1993 | Ahmad et al. | 324/158 R | 5,576,980 A | 11/1996 | Whetsel | 364/579 |
| 5,252,917 A | 10/1993 | Kadowaki | 324/158 R | 5,577,052 A | 11/1996 | Morris | 714/726 |
| 5,254,942 A | 10/1993 | D'Souza et al. | 324/158 R | 5,581,541 A | 12/1996 | Whetsel | 370/241 |
| 5,258,985 A | 11/1993 | Spence et al. | 371/22.4 | 5,590,275 A | 12/1996 | Van Berkel et al. | 395/183.06 |
| 5,260,949 A | 11/1993 | Hashizume et al. | 371/22.3 | 5,592,493 A | 1/1997 | Crouch et al. | 371/22.3 |
| 5,276,807 A | 1/1994 | Kodoma et al. | 395/309 | 5,600,788 A | 2/1997 | Lofgren et al. | 395/183 |
| 5,278,494 A | 1/1994 | Obigane | 324/158 F | 5,606,566 A * | 2/1997 | Whetsel | 714/729 |
| 5,279,975 A | 1/1994 | Devereaux et al. | 437/8 | 5,608,335 A | 3/1997 | Tailliet | 324/763 |
| 5,286,656 A | 2/1994 | Keown et al. | 437/7 | 5,608,736 A | 3/1997 | Bradford et al. | 371/22.3 |
| 5,291,025 A | 3/1994 | Smith | 250/561 | 5,610,530 A | 3/1997 | Whetsel | 324/763 |

| | | | |
|---|---|---|---|
| 5,610,826 A | 3/1997 | Whetsel | 364/487 |
| 5,619,462 A | 4/1997 | McClure | 365/201 |
| 5,623,500 A | 4/1997 | Whetsel | 371/22.1 |
| 5,623,503 A | 4/1997 | Rutkowski | 714/727 |
| 5,627,839 A | 5/1997 | Whetsel | 371/22.3 |
| 5,627,840 A | 5/1997 | Hundertmark et al. | 371/22.3 |
| 5,627,842 A | 5/1997 | Brown et al. | 714/727 |
| 5,640,404 A | 6/1997 | Satish | 371/22.3 |
| 5,648,661 A | 7/1997 | Rostoker et al. | 257/48 |
| 5,659,257 A | 8/1997 | Lu et al. | 324/763 |
| 5,659,773 A | 8/1997 | Huynh et al. | 395/821 |
| 5,673,276 A | 9/1997 | Jarwala et al. | 714/727 |
| 5,677,915 A | 10/1997 | Whetsel | 371/22.3 |
| 5,685,004 A | 11/1997 | Bruce et al. | 395/800 |
| 5,687,179 A | 11/1997 | Whetsel et al. | 371/22.3 |
| 5,701,307 A | 12/1997 | Whetsel | 371/22.3 |
| 5,706,235 A | 1/1998 | Roohparvar et al. | 365/201 |
| 5,706,297 A | 1/1998 | Jeppesen, III et al. | 371/22.3 |
| 5,708,773 A | 1/1998 | Jeppesen, III et al. | 714/30 |
| 5,710,779 A | 1/1998 | Whetsel | 371/22.3 |
| 5,715,171 A | 2/1998 | Mori et al. | 364/490 |
| 5,715,254 A | 2/1998 | Whetsel | 371/22.3 |
| 5,715,255 A | 2/1998 | Whetsel | 371/22.3 |
| 5,719,876 A | 2/1998 | Warren | 371/22.3 |
| 5,719,878 A | 2/1998 | Yu et al. | 371/22.3 |
| 5,744,949 A | 4/1998 | Whetsel | 324/158.1 |
| 5,760,643 A | 6/1998 | Whetsel | |
| 5,781,560 A | 7/1998 | Kawano et al. | 714/727 |
| 5,802,270 A | 9/1998 | Ko et al. | 395/183.03 |
| 5,805,609 A | 9/1998 | Mote, Jr. | 714/726 |
| 5,805,792 A | 9/1998 | Swoboda et al. | 395/183.04 |
| 5,825,785 A | 10/1998 | Barry et al. | 371/22.4 |
| 5,828,824 A | 10/1998 | Swoboda | 395/183.01 |
| 5,828,825 A | 10/1998 | Eskandari et al. | 395/183.03 |
| 5,841,670 A | 11/1998 | Swoboda | 364/578 |
| 5,841,791 A | 11/1998 | Hashizume | 371/22.3 |
| 5,847,561 A | 12/1998 | Whetsel | 324/158.1 |
| 5,862,152 A | 1/1999 | Handly et al. | 371/22.32 |
| 5,872,908 A | 2/1999 | Whetsel | 395/183.06 |
| 5,883,524 A | 3/1999 | Whetsel | 326/16 |
| 5,884,023 A | 3/1999 | Swoboda et al. | 395/183.06 |
| 5,887,001 A | 3/1999 | Russell | 714/726 |
| 5,887,004 A | 3/1999 | Walther | 371/22.31 |
| 5,905,738 A | 5/1999 | Whetsel | 371/22.4 |
| 5,907,562 A | 5/1999 | Wrape et al. | 371/22.31 |
| 5,949,984 A | 9/1999 | Fujitaka | 395/500 |
| 5,958,072 A | 9/1999 | Jacobs et al. | 714/30 |
| 5,968,191 A | 10/1999 | Thatcher et al. | 714/723 |
| 5,968,192 A | 10/1999 | Kornachuk et al. | 714/724 |
| 6,000,051 A | 12/1999 | Nadeau-Dostie et al. | 714/727 |
| 6,006,343 A | 12/1999 | Whetsel | 714/28 |
| 6,028,983 A | 2/2000 | Jaber | 395/183.06 |
| 6,035,431 A | 3/2000 | Higashida | 714/726 |
| 6,037,794 A | 3/2000 | Yamamoto et al. | 324/760 |
| 6,046,600 A | 4/2000 | Whetsel | 324/763 |
| 6,055,656 A | 4/2000 | Wilson, Jr. et al. | 714/724 |
| 6,073,254 A | 6/2000 | Whetsel | 714/30 |
| 6,115,763 A | 9/2000 | Douskey et al. | 710/72 |
| 6,158,035 A | 12/2000 | Whetsel et al. | 714/731 |
| 6,199,182 B1 | 3/2001 | Whetsel | 714/724 |
| 6,223,315 B1 | 4/2001 | Whetsel | 714/727 |
| 6,242,269 B1 | 6/2001 | Whetsel | 438/11 |
| 6,260,165 B1 | 7/2001 | Whetsel | 714/727 |
| 6,286,121 B1 | 9/2001 | Osawa et al. | 714/738 |
| 6,311,302 B1 * | 10/2001 | Cassetti et al. | 714/727 |
| 6,324,614 B1 | 11/2001 | Whetsel | 710/130 |
| 6,324,662 B1 | 11/2001 | Haroun et al. | 714/724 |
| 6,334,198 B1 * | 12/2001 | Adusumilli et al. | 714/727 |
| 6,343,365 B1 | 1/2002 | Matsuzawa et al. | 714/726 |
| 6,385,749 B1 | 5/2002 | Adusumilli et al. | 714/733 |
| 6,408,413 B1 | 6/2002 | Whetsel | 714/727 |
| 6,418,545 B1 | 7/2002 | Adusumilli | 714/729 |
| 6,446,230 B1 | 9/2002 | Chung | 714/726 |
| 6,457,148 B1 | 9/2002 | Yoshiba | 714/718 |
| 6,560,734 B1 | 5/2003 | Whetsel | 714/724 |
| 6,587,981 B1 * | 7/2003 | Muradali et al. | 714/726 |
| 6,658,614 B1 * | 12/2003 | Nagoya | 714/727 |
| 6,711,707 B1 | 3/2004 | Haroun et al. | 714/726 |
| 6,804,725 B1 | 10/2004 | Whetsel | 710/5 |

FOREIGN PATENT DOCUMENTS

| | | |
|---|---|---|
| EP | 0148403 | 7/1985 |
| EP | 0190494 | 8/1986 |
| EP | 0195164 | 9/1986 |
| EP | 0273821 | 7/1988 |
| EP | 0310152 | 4/1989 |
| EP | 0315475 A2 | 10/1989 |
| EP | 0518550 A2 | 12/1992 |
| EP | 0522413 A2 | 1/1993 |
| EP | 0604032 A2 | 6/1994 |
| GB | 2220272 A | 1/1990 |
| GB | 2266965 A | 11/1993 |
| JP | 57-094857 A | 6/1982 |
| JP | 57-209546 | 12/1982 |
| JP | 58-155599 | 9/1983 |
| JP | 58-191021 A | 11/1983 |
| JP | 59-210382 | 11/1984 |
| JP | 60-140834 A | 7/1985 |
| JP | 60-252958 | 12/1985 |
| JP | 60-262073 | 12/1985 |
| JP | 62-031447 A | 2/1987 |
| JP | 62-228177 | 10/1987 |
| JP | 62-280663 | 12/1987 |
| JP | 63-073169 | 4/1988 |
| JP | 63-188783 A | 8/1988 |
| JP | 63-198884 | 8/1988 |
| JP | 63-213014 A | 9/1988 |
| JP | 63-310046 A | 12/1988 |
| JP | 64-006572 | 1/1989 |
| JP | 01-038674 A | 2/1989 |
| JP | 01-043773 | 2/1989 |
| JP | 01-068167 A | 3/1989 |
| JP | 01-079673(A) | 3/1989 |
| JP | 01-110274 | 4/1989 |
| JP | 01-170873 | 7/1989 |
| JP | 02-016642 (A) | 1/1990 |
| JP | 02-062984 | 3/1990 |
| JP | 02-052165 | 4/1990 |
| JP | 05-142298 | 6/1993 |

OTHER PUBLICATIONS

"IEEE Standard Test Access Port and Boundary-Scan Architecture," IEEE Computer Society, Oct. 21, 1993.

"SCANPSC110F SCAN.TM. Bridge Hierarchical and Multidrop Addressable JTAG Port (IEEE 1149.1 System Test Support)," National Semiconductor, Sep. 1, 1993, pp. 1-32.

"SN54ACT8999, SN74ACT8999 Scan Path Selectors with 8-Bit Bidirectional Data Buses," Texas Instruments Product Review, Jun. 1, 1990, pp. 11-166 to 11-194.

Adshead, Dave, "Embedded Systems: JTAG Accelerates Debugging Process," Electronic Engineering Times, Jun. 22, 1998, pp. 106.

Avra, LaNae, "A VHSIC ETM-BUS Compatible Test and Maintenance Interface", 1987 International Test Conference, Sep. 1-3, 1987, Paper 41.2, pp. 964-971.

Bhavsar, D., "An Architecture for Extending the IEEE Standard 1149.1 Test Access Port to System Backplanes", International Test Conference 1991, pp. 768-776, Jan. 1, 1991.

Bhavsar, D., "Chapter 17. Designs that Help Test Interconnect Shorts", IEEE, Jan. 1, 1990, pp. 183-189.

Bhavsar, D., et al., "Self-Testing by Polynomial Division", Digest of Papers, International Test Conference, Jan. 1, 1981, pp. 208-216.

Blair, Jack D.; et al., "A 16-Mbit/s Adapter Chip for the IBM Token-Ring Local Area Network", IEEE Journal of Solid-State Circuits, vol. 24, No. 6, Dec. 1, 1989, pp. 1647-1654.

Breuer, Melvin A.; Lien, Jung-Cheun, "A Test and Maintenance Controller for a Module Containing Testable Chips", 1988 International Test Conference, Sep. 12-14, 1988, Paper 27.1, pp. 502-513.

Bruce, W. C., et al., "Implementing 1149.1 on CMOS Processors", IEEE International Test Conference 1992, Paper BP-91, pp. 999-1006, Jan. 1, 1992.

Carbine, Adrian and Feltham, Derek, "Pentium Pro Processor Design for Test and Debug," International Test Conference 1997, Nov. 1-6, 1997, pp. 294-303, IEEE Computer Society.

Colwell, Robert P. and Steck, Randy L., "TP 10.4: A 0.6um BiCMOS Processor with Dynamic Execution," 1995 IEEE International Solid-State Circuits Conference, Feb. 15-17, 1995, pp. 176-177.

Dervisoglu, Bulent I., "Using Scan Technology for Debug and Diagnostics in a Workstation Environment", 1988 International Test Conference, Sep. 12-14, 1988, Paper 45.2, pp. 976-986.

Dervisoglu, Bulent, "IEEE P1149.2 Description and Status Report", IEEE Design and Test of Computers, Sep. 1, 1992, pp. 79-81.

Dervisoglu, Bulent, et al., "Shared I/O-Cell Structures: A Framework for Extending the IEEE 1149.1 Boundary-Scan Standard", Int'l Test Conference, Oct. 19, 1998, pp. 908-989.

El-ziq, et al., "A Mixed-Mode Built-In Self-Test Technique Using Scan Path and Signature Analysis", International Test Conference, Oct. 18-20, 1983, pp. 269-274.

ETM-Bus Specification, VHSIC Phase 2 Interoperability Standards, Dec. 31, 1985, Version 1.0.

George, David, "Use a reprogramable approach to boundary scan for FPGAs", EDN, Electrical Design News, vol. 38, No. 16, Aug. 5, 1993, pp. 97-104.

Gerstendorfer, S. et al. "Minimized Power Consumption for Scan-Based BIST", Proceedings International Test Conference, Sep. 28-30, 1999 (IEEE Cat. No. 99CH37034) pp. 77-84.

Gott, Robert A., "Embedded Systems: Debugging Embedded Software," pp. 71-73, 76, 78, Computer Design, Feb. 1, 1998.

Haedtke, et al., "Multilevel Self-test for the Factory and Field", Proceedings, Annual Relaibility and Maintainability Symposium, Jan. 1, 1987.

Hahn, et al., "VLSI Testing By On-Chip Error Detection", IBM Technical Disclosure Bulletin, vol. 25, No. 2, Jul. 1, 1982.

Heatherington, G. et al., "Logic BIST for Large Industrial Designs: Real Issues and Case Studies," Proceedings International Test Conference, Sep. 28, 1999, IEEE vol. CONF. 30, pp. 358-367.

Hudson, et al., "Integrating BIST And Boundary-Scan On A Board", Proceedings of the National Communications Forum, Sep. 30, 1988, pp. 1796-1800.

Hudson, et al., "Parallel Self-test With Pseudo-Random Test Patterns", International Test Conference, Sep. 1-3, 1987, pp. 954-963.

Hunter, C., et al., "Design and Implementation of the 'G2' PowerPC™ 603e™ Embedded Microprocessor Core", IEEE International Test Conference Proceedings, Oct. 18-23, 1998.

IBM Technical Disclosure Bulletin, "Bidirectional Double Latch", vol. 28, No. 1, Jun., 1, 1985.

IBM Technical Disclosure Bulletin, "Self-Contained IBM Performance Monitor for a Personal Computer", Dec., 1, 1988, vol. 3, No. 7, pp. 376-377.

IBM Technical Disclosure Bulletin, "Test Bus Architecture", vol. 32, No. 3A, Aug. 1, 1989, pp. 21-27.

IEEE P1149.2—D2.5, "Extended Digital Serial Subset", Unapproved Draft Published for Comment Only, Aug. 30, 1994, pp. 1/37.

Intel, "80386 Programmer's Reference Manual 1986", Chapter 12: Debugging, pp. 12-1-12-9, Jan. 18, 1988.

Intel, "Intel386™ DX Microprocessor Data Sheet," Section 2.11: Testability, Jan. 1, 1988.

Intel, "Microprocessor and Peripheral Handbook", 80386 Preliminary, Section 2.11: Testability, Jan. 1, 1988.

Jarwala, Madhuri, "A Framework for Design for Testability of Mixed Analog/Digital Circuits", IEEE 1991 Custom Integrated Circuits Conference, pp. 13.5.1-13.5.4, Jan. 1, 1991.

Joint Test Action Group, Technical Sub-Committee, "A Standard Boundary Scan Architecture", Jan. 1, 1988.

Jungert, H., et al., "JTAG: Standard Testing of Complex Systems. Part 3: Bus Drivers and Latches with JTAG Test Ports", Elektronik, Messen und Testen, No. 14, Jul. 7, 1989, pp. 96-103, with translation.

Kuban, John R. and Bruce, William C, "Self-Testing the Motorola MC6804P2," IEEE Design & Test, May, 1984, earlier version in International Test Conference Proceedings, Oct. 1, 1983.

Laurent, "An Example of Test Strategy for Computer Implemented with VLSI Circuits", IEEE International Conference on computer Design: VLSI in Computers, Oct. 7-10, 1985, pp. 679-682.

Lee, Nai-Chi, "A Hierarchical Analog Test Bus Framework for Testing Mixed-Signal Integrated Circuits and Printed circuit Boards", Journal of Electronic Testing: Theory and Applications, 4(1993), Nov. 1, 1993, No. 4, Dordrecht, NE, pp. 361-368.

Lien, Jung-Cheun; Breuer, Melvin A., "A Universal Test and Maintenance Controller for Modules and Boards", IEEE Transactions on Industrial Electronics, vol. 36, No. 2, May 1, 1989, pp. 231-240.

Lofstrom, Keith, "A Demonstration IC for the P1149.4 Mixed-Signal Test Standard", IEEE International Test Conference 1996, Paper 4.2, pp. 92-98, Jan. 1, 1996.

Loftstrom, Keith, "Early Capture for Boundary Scan Timing Measurements", International Test Conference 1996, Oct. 20-25, 1996, pp. 417-422.

Maierhofer, J., "Heirarchial Self-Test Concept Based on the JTAG Standard", IEEE International Test Conference 1990, Paper 5.2, pp. 127-134, Jan. 1, 1990.

Marinissen, Erik Jan, IEEE P1500 Core Test Standardization, Philips Research Laboratories, Nov., 1, 1997, P1500 Meeting, ITC Test Week, Washington, D.C.

Marlett, et al., "RISP Methodology", Electronic Engineering, Feb., 1, 1989, pp. 45-48.

Marwedel, Peter, "Processor-Core Based Design and Test", IEEE 0-7803-3662-3/97, 1997 IEEE, Jan. 1, 1997.

Maunder, C., "A Universal Framework for Managed Built-In Test", International Test Conference 1993, Jan. 1, 1993, pp. 21-29, 1993 IEEE.

Maunder, Colin, and Beenker, Frans, "Boundary-Scan: A Framework for Structured Design-for-Test," paper 30.1, International Test Conference 1987 Proceedings, Sep. 1-3, 1987.

Mixed-Signal Working Group, "Standard for a Mixed Signal Test Bus", D11, Mar. 1, 1997, pp. 1-51.

Ohletz, et al., "Overhead in Scan and Self-testing Designs", International Test Conference, Sep. 1-3, 1987, pp. 460-470.

Ohsawa, et al., "A 60-ns $-Mbit CMOS DRAM with Built-In self-Test Function", IEEE Journal of Solid-State Circuits, vol. SC-22, No. 5, Oct. 1, 1987, pp. 663-668.

Paraskeva, et al., "New Test Structure for VLSI Self-Test: The Structured Test Register", 8030 Electronic Letters, 21 (1985) Sep. No. 19, Stenenage, Herts, Great Britain, Jul. 26, 1985.

Parker, "The Impact of Boundary Scan on Board Test", IEEE design & Test of Computers, Aug., 1, 1989, pp. 18-30.

Parker, Kenneth, et al., "Structure and Methodology for an Analog Testability Bus", IEEE International Test Conference 1993, Paper 15.2, pp. 309-322, Jan. 1, 1993.

Pradhan, M.M., et al., "Circular BIST with Partial Scan," 1988 International Test Conference, Sep. 12-14, 1987, Paper 35.1, pp. 719-727.

Russell, "The JTAG Proposal and Its Impact On Automatic Test", ATE & Instrumentation Conference, Sep., 1, 1988, pp. 289-297.

Sabo, et al., "Genesil Silicon Compilation and Design For Testability", IEEE Custom Integrated Circuits Conference, May 12-15, 1986, pp. 416-420.

Sasidhar, K, Chatterjee, A., Zorian, Y., "Optimal Multiple Chain Relay Testing Scheme for MCMs on Large Area Substrates," 1996 IEEE International Test Conference, Paper 31.1, pp. 818-827, Jan. 1, 1996.

Sasidhar, K, Chatterjee, A., Zorian, Y., "Relay Propagation Scheme for Testing of MCMs on Large Area Substrates," 1996 IEEE 1066-1409/96, pp. 131-135, Jan. 1, 1996.

Sellers, et al., "Error Detecting Logic for Digital Computers", McGraw-Hill Co., Jan. 1, 1968 pp. 207-211.

Sharp, John, "JTAG Emulation Systems Explore Embedded Cores," pp. 62, Electronic Engineering Times, Jun. 15, 1998.

Sunter, S.K., "Cost/Benefit Analysis of the P1149.4 Mixed-signal Test Bus", IEE Proceedings, Circuits, Devices, Systems, vol. 143, No. 6, Dec., 1, 1996, pp. 393-398.

Sunter, Stephen, "A Low Cost 100 MHz Analog Test Bus", IEEE 1995, pp. 60-65, Jan. 1, 1995.

Tanenbaum, Andrew S., Structured Computer Organization, Prentice-Hall, Jan. 1, 1984, pp. 10-12.

Texas Instruments Data Book, Jan. 1, 1991, "Advanced Logic Bus Interface Logic", pp. 11-3, 11-11, 11-18, 11-19, 11-23, 11-82, 11-83, 11-84, 11-85.

van Riessen, R. P., Kerkhoff, H. G., Kloppenburg, A., "Design and Implementation of a Hierarchical Testable Architecture Using the Boundary Scan Standard", Proceedings, 1st European Test Conference, Paris, France, Apr. 12-14, 1989, pp. 112-118.

Wagner, "Interconnect Testing With Boundary Scan", International Test Conference Proceedings, Sep. 1-3, 1987, pp. 52-57.

Wang, et al., "Concurrent Built-In Logic Block Observer (CBILBO)", IEEE International Symposium On Circuits and Systems, May 5-7, 1986, vol. 3, pp. 1054-1057.

Wang, Laung-Terng; Marhoefer, Michael; McCluskey, Edward, J., "A Self-Test and Self-Diagnosis Architecture for Boards Using Boundary Scan", Proceedings 1st European Test Conference, Paris, Apr. 12-14, 1989, pp. 119-126.

Whetsel, Lee, "An IEEE 1149.1 Based Test Access Architecture for ICs With Embedded Cores", International Test Conference 1997, Nov. 1-6, 1997, pp. 69-78.

Whetsel, Lee, "An IEEE 1149.1 Based Test Access Architecture For ICs With Embedded Cores", International Test Conference 1997, Nov. 1-6, 1997, pp. 69-78.

Whetsel, Lee, "Improved Boundary Scan Design", IEEE International Test Conference 1995 Proceedings, Oct. 21-25, 1995, Paper 36.2, pp. 851-860.

Whetsel, Lee, "A Proposed Standard Test Bus and Boundary Scan Architecture", IEEE International Conference on Computer Design: VLSI in Computers & Processes, Oct. 3-5, 1988, pp. 330-333.

Whetsel, Lee, "A Standard Test Bus and Boundary Scan Architecture," pp. 48-59, Texas Instruments Technical Journal, Jul. 1-Aug. 1988, vol. 5, No. 4.

Whetsel, Lee, "A View of the JTAG Port and Architecture", ATE & Instrumentation Conference West, Jan. 11-14, 1988, pp. 385-401.

Whetsel, Lee, "Addressable Test Ports: An Approach To Testing Embedded Cores," 1999 ITC & TI Test Symposium, Sep. 28-30, 1999.

Whetsel, Lee, "An IEEE 1149.1 Based Logic/Signature Analyzer in a Chip," International Test Conference 1991 Proceedings, Oct. 26-30, 1991.

Whetsel, Lee, "IEE STD. 1149.1—An Introduction", NEPCON, Feb., 1, 1993, 10 pages.

Whetsel, Lee, "JTAG Compatible Devices Simplify Board Level Design For Testability," 8080 Wescon Conference Record 33 (1989) Nov. 1, 1989, pp. 294-299.

Winters, Mike, "Using IEEE-1149.1 For In-Circuit Emulation", WESCON/1994, pp. 525-528, Sep. 27-27, 1994.

Zorian, Yervant; Jarwala, Najmi, "Designing Fault-Tolerant, Testable, VLSI Processors Uasing the IEEE P1149.1 Boundary Scan Architecture", 7th IEEE International Conferenceon Computer Design: VLSI in Computers & Processors, Oct. 2-4, 1989.

* cited by examiner

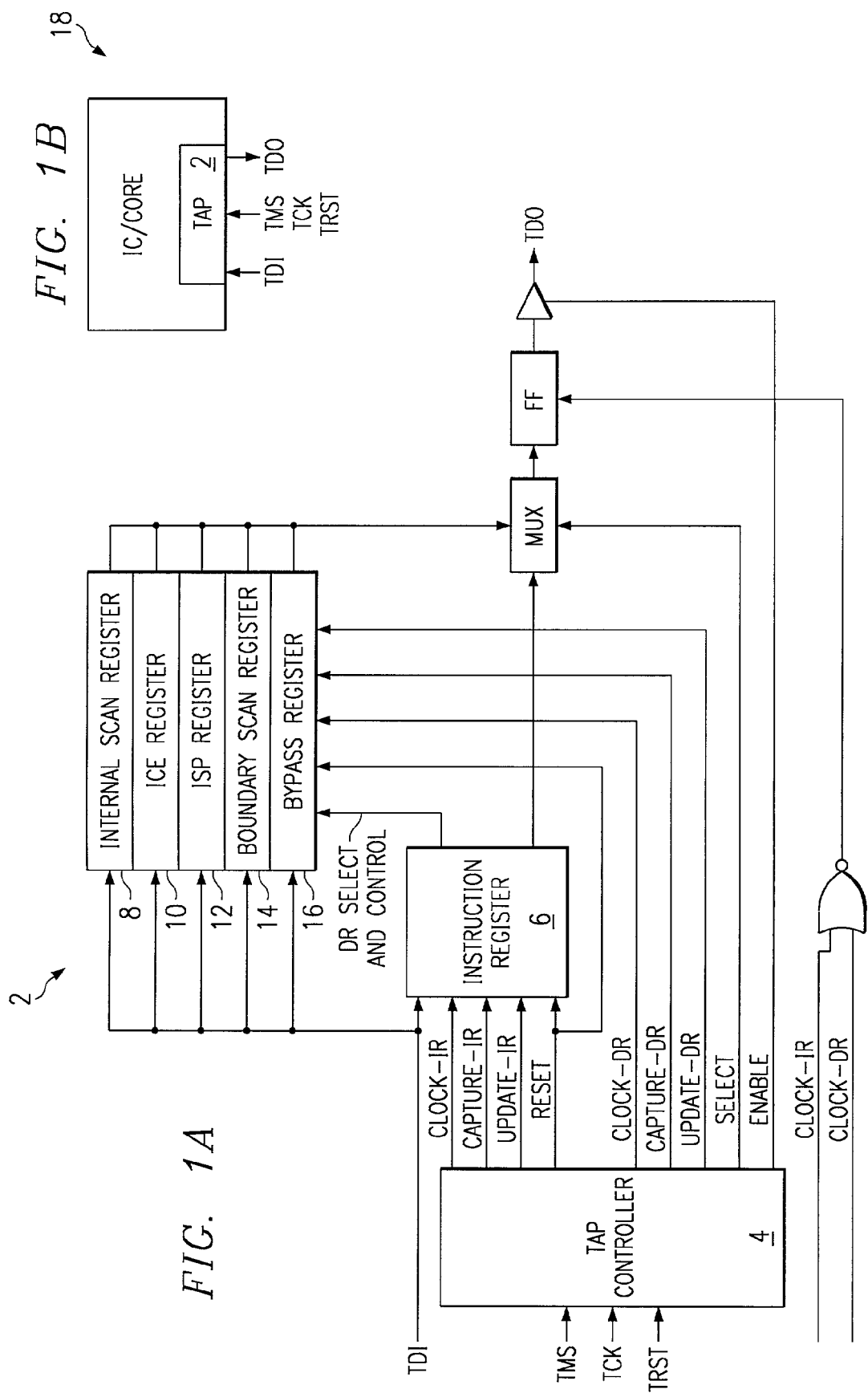

SELECTING DIFFERENT 1149.1 TAP DOMAINS FROM UPDATE-IR STATE

This application claims priority under 35 USC 119(e)(1) of provisional application Ser. No. 60/207,691, filed May 26, 2000.

CROSS REFERENCE TO RELATED APPLICATIONS

This application is related to 1) application Ser. No. 08/918,872, filed Aug. 26, 1999, now U.S. Pat. No. 6,073,254, "Selectively Accessing Test Access Ports in a Multiple Test Access Port Environment", which is hereby incorporated by reference, 2) application Ser. No. 09/458,313, filed Dec. 10, 1999, "Selectively Accessing Test Access Ports in a Multiple Test Access Port Environment", which is hereby incorporated by reference, and 3) application Ser. No. 09/277,504, filed Mar. 26, 1999, "A TAP and Linking Module for Scan Access of Multiple Cores with 1149.1 Test Access Ports", which is hereby incorporated by reference.

FIELD OF THE INVENTION

The present invention relates generally to integrated circuits and, more particularly, to test interfaces for integrated circuits and/or cores.

BACKGROUND OF THE INVENTION

FIG. 1A illustrates the test architecture of a conventional 1149.1 TAP 2. The TAP 2 includes a TAP controller 4, instruction register 6, set of data register including; (1) an internal scan register 8, (2) an in-circuit emulation (ICE) register 10, (3) an in-system programming (ISP) register 12, (4) a boundary scan register 14, and (5) a bypass register 16. Of the data registers, the boundary scan register 14 and bypass register 16 are defined by the IEEE 1149.1 standard. The other shown data registers are not defined by 1149.1, but can exist as data registers within the 1149.1 architecture. The TAP controller 4 responds to the TCK and TMS inputs to coordinate serial communication through either the instruction register 6 from TDI to TDO, or through a selected one of the data registers from TDI to TDO. The TRST input is used to initialize the TAP 2 to a known state. The operation of the TAP 2 is well known.

FIG. 1B illustrates an IC or intellectual property core circuit 18 incorporating the TAP 2 and its TDI, TDO, TMS, TCK, and TRST interface. A core circuit is a complete circuit function that is embedded within an IC, such as a DSP or CPU. FIGS. 1C–1F illustrate the association between each of the data registers of FIG. 1A and the target circuit they connect to and access.

FIG. 2 illustrates the state diagram of the TAP controller 4 of FIG. 1A. The TAP controller is clocked by the TCK input and transitions through the states of FIG. 2 in response to the TMS input. As seen in FIG. 2, the TAP controller state diagram consists of four key state operations, (1) a Reset/Run Test Idle state operation where the TAP controller goes to either enter a reset state, a run test state, or an idle state, (2) a Data or Instruction Scan Select state operation the TAP controller may transition through to select a data register (DR) or instruction register (IR) scan operation, or return to the reset state, (3) a Data Register Scan Protocol state operation where the TAP controller goes when it communicates to a selected data register, and (4) an Instruction Register Scan Protocol state operation where the TAP controller goes when it communicates to the instruction register. The operation of the TAP controller is well known.

FIG. 3 illustrates an example arrangement for connecting multiple TAP domains within an IC 20. The FIG. 3 example and other TAP domain linking arrangement examples are described in application Ser. No. 08/918,872, filed Aug. 26, 1999, now U.S. Pat. No. 6,073,254. Each TAP domain in FIG. 3 is a complete TAP architecture similar to that shown and described in regard to FIG. 1A. While only one IC TAP domain 22 exists in an IC, any number of core TAP domains (1-N) may exist within an IC. As seen in FIG. 3, the IC TAP domain 22 and Core 1-N TAP domains $24_1$–$24_n$ are daisy-chained between the IC's TDI and TDO pins. All TAP domains are connected to the IC's TMS, TCK, and TRST signals and operate according to the state diagram of FIG. 2. During instruction scan operations, instructions are shifted into each TAP domain instruction register. One drawback of the TAP domain arrangement of FIG. 3 is that it does not comply with the IEEE 1149.1 standard, since, according to the rules of that standard, only the ICs TAP domain should be present between TDI and TDO when the IC is initially powered up. A second drawback of the TAP domain arrangement of FIG. 3 is that it may lead to unnecessarily complex access for testing, in-circuit emulation, and/or in-circuit programming functions associated with ones of the individual TAP domains.

For example, if scan testing is required on circuitry associated with the Core 1 TAP domain, each of the scan frames of the test pattern set developed for testing the Core 1 circuitry must be modified from their original form. The modification involves adding leading and trailing bit fields to each scan frame such that the instruction and data registers of the leading and trailing TAP domains become an integral part of the test pattern set of Core 1. Serial patterns developed for in-circuit emulation and/or in-circuit programming of circuitry associated with the TAP domain of Core 1 must be similarly modified. To overcome these and other drawbacks of the TAP arrangement of FIG. 3, the invention as described below is provided.

BRIEF DESCRIPTION OF THE DRAWINGS

FIG. 1A illustrates the test architecture of a conventional 1149.1 TAP.

FIG. 1B illustrates an IC or intellectual property core circuit incorporating the TAP and its TDI, TDO, TMS, TCK, and TRST interface.

DETAILED DESCRIPTION OF THE INVENTION

Figure 4:
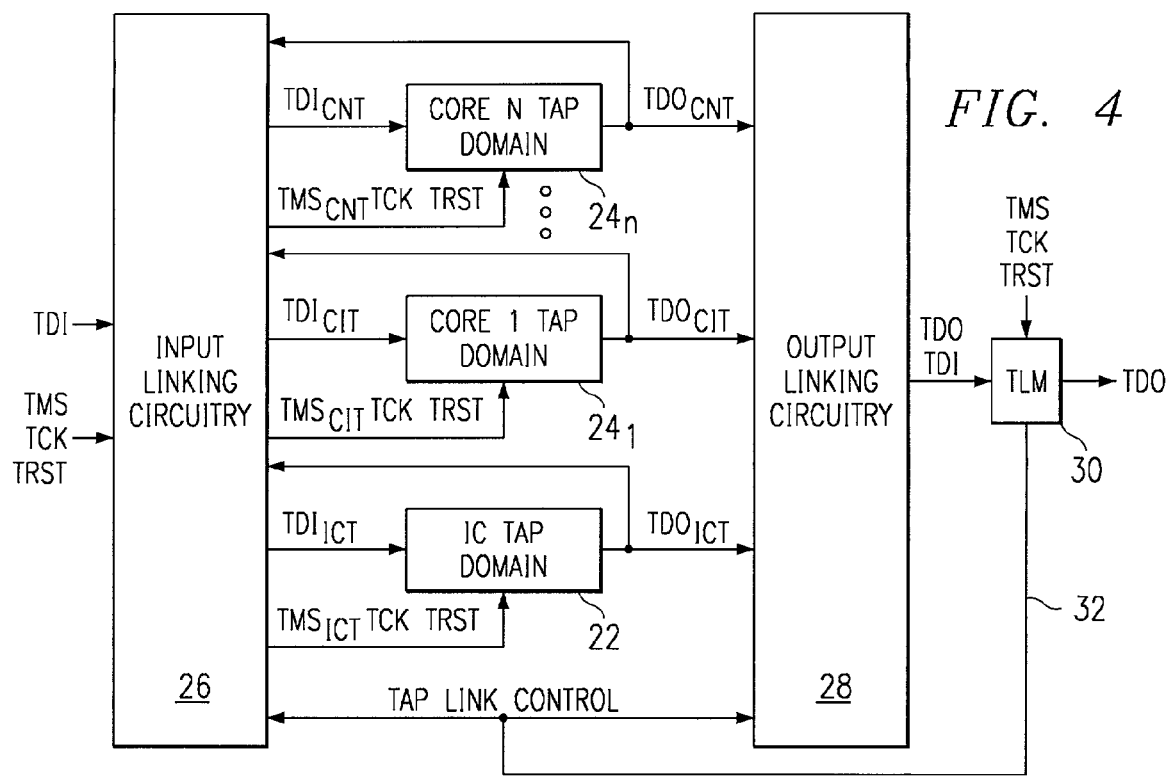
FIG. 4 illustrates a structure for connecting multiple TAP domains within an IC according to the present invention.

FIG. 4 illustrates the preferred structure for connecting multiple TAP domains within an IC according to the present invention. The structure of the present invention includes input linking circuitry 26 and output linking circuitry 28 for connecting any one or more TAP domains to the ICs TDI, TDO, TMS, TCK and TRST pins, and a TAP Linking Module (TLM) 30 circuit for providing the control to operate the input and output linking circuitry. The concept of input and output linking circuitry and use of a TLM circuit to control the input and output linking circuitry is disclosed in application Ser. No. 08/918,872, filed Aug. 26, 1999, now U.S. Pat. No. 6,073,254.

Figure 5:
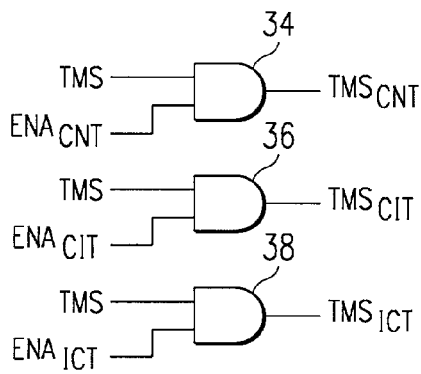
FIG. 5 illustrates circuitry for providing the gated $TMS_{ICT}$, $TMS_{CIT}$, and $TMS_{CNT}$ signals.

The input linking circuitry 26 receives as input; (1) the TDI, TMS, TCK, and TRST IC pins signals, (2) the TDO outputs from the IC TAP (ICT) domain 22 ($TDO_{ICT}$), the Core 1 TAP (CIT) domain $24_1$ ($TDO_{CIT}$), and the Core N TAP (CNT) domain $24_n$ ($TDO_{CNT}$), and (3) TAP link control input from the TLM 30. The TCK and TRST inputs pass unopposed through the input linking circuitry 26 to be input to each TAP domain. The TMS input to the input linking circuitry 26 is gated within the input linking circuitry such that each TAP domain receives a uniquely gated TMS output signal. As seen in FIG. 4, the IC TAP domain 22 receives a gated $TMS_{ICT}$ signal, the Core 1 TAP domain $24_1$ receives a gated $TMS_{CIT}$ signal, and the Core N TAP domain $24_n$ receives a gated $TMS_{CNT}$ signal. Example circuitry for providing the gated $TMS_{ICT}$, $TMS_{CIT}$, and $TMS_{CNT}$ signals is shown in FIG. 5. In FIG. 5, the $ENA_{ICT}$, $ENA_{CIT}$, and $ENA_{CNT}$ signals used to gate the $TMS_{ICT}$, $TMS_{CIT}$, and $TMS_{CNT}$ signals, respectively, come from the TLM 30 via the TAP link control bus 32.

Figure 2:
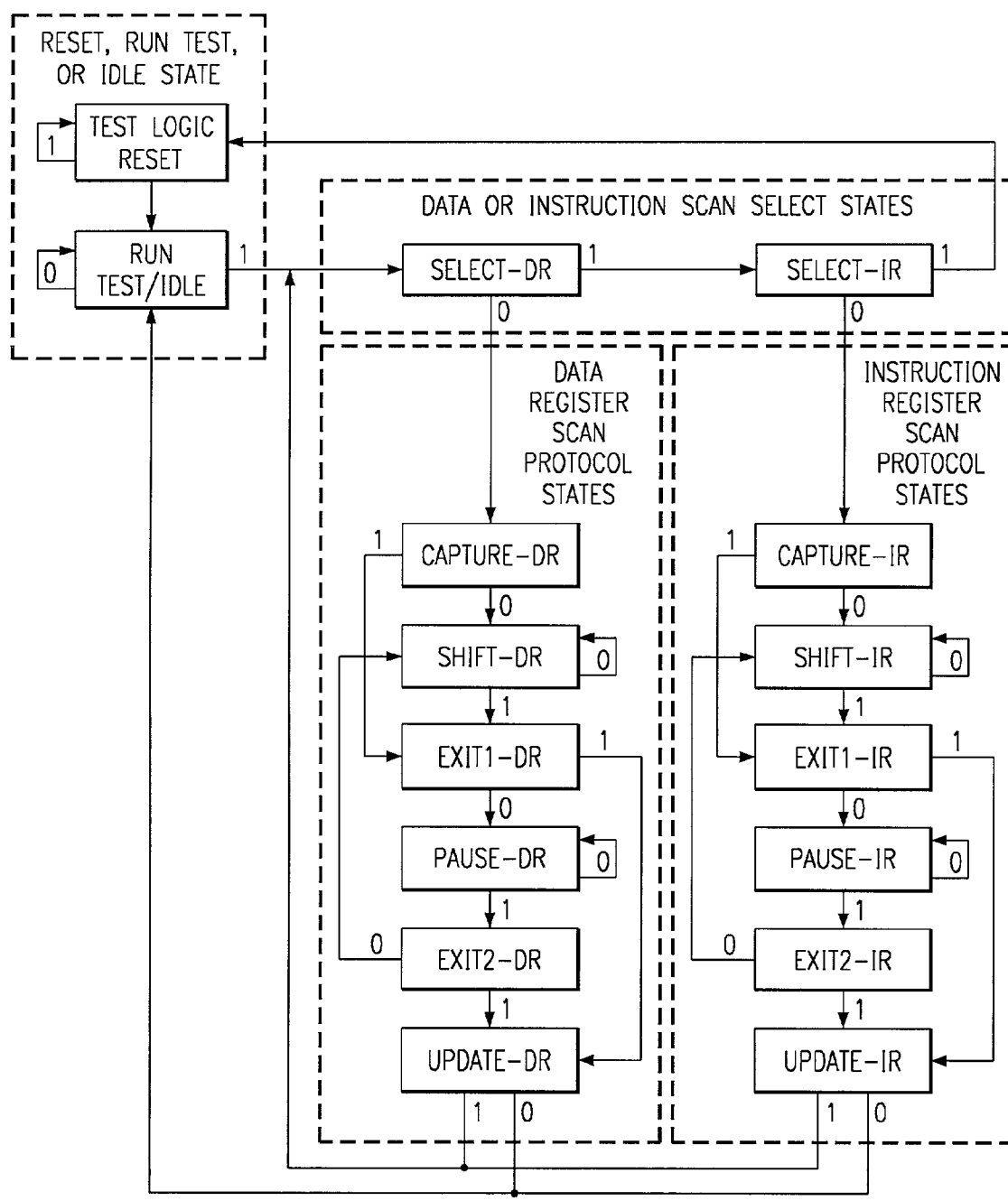
FIG. 2 illustrates the state diagram of the TAP controller of FIG. 1A.

From FIG. 5 it is seen that $TMS_{CNT}$ can be connected by way of AND gate 34 to TMS to enable the Core N TAP domain or be gated low to disable the Core N TAP domain, $TMS_{CIT}$ can be connected by way of AND gate 36 to TMS to enable the Core 1 TAP domain or be gated low to disable the Core 1 TAP domain, and $TMS_{ICT}$ can be connected by way of AND gate 38 to TMS to enable the IC TAP domain or be gated low to disable the IC TAP domain. When a TAP domain TMS input ($TMS_{CNT}$, $TMS_{CIT}$, $TMS_{ICT}$) is gated low, the TAP domain is disabled by forcing it to enter the Run Test/Idle state of FIG. 2. A disabled TAP domain will remain in the Run Test/Idle state until it is again enabled by coupling it to the IC's TMS pin input as mentioned above. These methods of enabling TAP domains from the Run Test/Idle state and disabling TAP domains to the Run Test/Idle state are disclosed in application Ser. No. 08/918, 872, filed Aug. 26, 1999, now U.S. Pat. No. 6,073,254.

Figure 6:
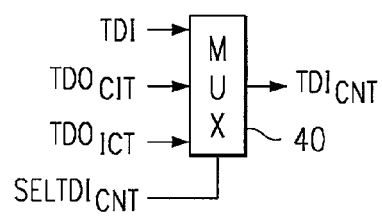
FIG. 6 illustrates circuitry for providing the $TDI_{ICT}$, $TDI_{CIT}$, and $TDI_{CNT}$ input signals.

The TDI, $TDO_{CNT}$, $TDO_{CIT}$, and $TDO_{ICT}$ inputs to the input linking circuitry 26 are multiplexed by circuitry within the input linking circuitry such that each TAP domain receives a uniquely selected TDI input signal. As seen in FIG. 4, the IC TAP domain 22 receives a $TDI_{ICT}$ input signal, the Core 1 TAP domain $24_1$ receives a $TDI_{CIT}$ input signal, and the Core N TAP domain $24_n$ receives a $TDI_{CNT}$ input signal. Example circuitry for providing the $TDI_{ICT}$, $TDI_{CIT}$, and $TDI_{CNT}$ input signals is shown in FIG. 6. In FIG. 6, the $SELTDI_{ICT}$, $SELTDI_{CIT}$, and $SELTDI_{CNT}$ control signals used to select the source of the $TDI_{ICT}$, $TDI_{CIT}$, and $TDI_{CNT}$ input signals, respectively, come from the TLM 30 via the TAP link control bus 32. From FIG. 6 it is seen that $TDI_{CNT}$ can be selectively connected by way of multiplexer 40 to TDI, $TDO_{CIT}$, or $TDO_{ICT}$, $TDI_{CIT}$ can be selectively connected by way of multiplexer 42 to TDI, $TDO_{CNT}$, or $TDO_{ICT}$, and $TDI_{ICT}$ can be selectively connected by way of multiplexer 44 to TDI, $TDO_{CNT}$, or $TDO_{CIT}$.

Figure 7:
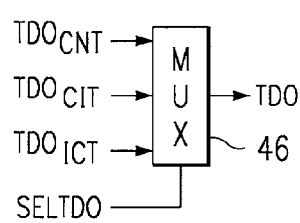
FIG. 7 illustrates circuitry for multiplexing of the $TDO_{ICT}$, $TDO_{CIT}$, and $TDO_{CNT}$ signals to the TDO output.

The output linking circuitry 28 receives as input; (1) the $TDO_{CNT}$ output from the Core N Tap domain $24_n$, the $TDO_{CIT}$ output from the Core 1 TAP domain $24_1$, the $TDO_{ICT}$ output from the IC TAP domain 22, and TAP link control input from the TLM 30. As seen in FIG. 4, the output linking circuitry 28 outputs a selected one of the $TDO_{CNT}$, $TDO_{CIT}$, and $TDO_{ICT}$ input signals to the TLM 30 via the output linking circuitry TDO output. Example circuitry for providing the multiplexing of the $TDO_{ICT}$, $TDO_{CIT}$, and $TDO_{CNT}$ signals to the TDO output is shown in FIG. 7. In FIG. 7, the SELTDO control input used to switch the $TDO_{ICT}$, $TDO_{CIT}$, or $TDO_{CNT}$ signals to TDO come from the TLM 30 via the TAP link control bus 32. From FIG. 7 it is seen that any one of the $TDO_{CNT}$, $TDO_{CIT}$, and $TDO_{ICT}$ signals can be selected as the input source to the TLM 30 by way of multiplexer 46.

The TLM circuit 30 receives as input the TDO output from the output linking circuitry 28 and the TMS, TCK, and TRST IC input pin signals. The TLM circuit 30 outputs to the IC's TDO output pin. From inspection, it is seen that the TLM 30 lies in series with the one or more TAP domains selected by the input and output linking circuitry 26, 28.

As described above, the TLM's TAP link control bus 32 is used to control the input and output connection circuitry to form desired connections to one or more TAP domains so that the one of more TAP domains may be accessed via the IC's TDI, TDO, TMS, TCK and TRST pins. According to the present invention and as will be described in detail below, the TAP link control bus signals are output from the TLM 30 during the Update-IR state of the IEEE TAP controller state diagram of FIG. 2.

Figure 1C:
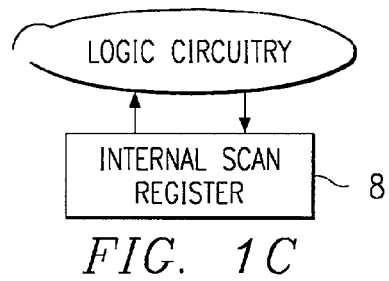
FIGS. 1C–1F illustrate the association between each of the data registers of FIG. 1A and the target circuit they connect to and access.
Figure 1D:
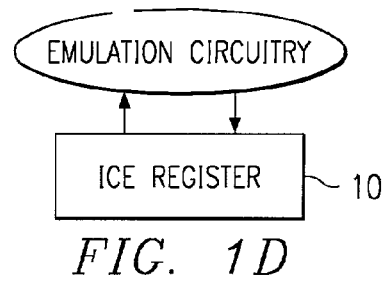
Figure 1E:
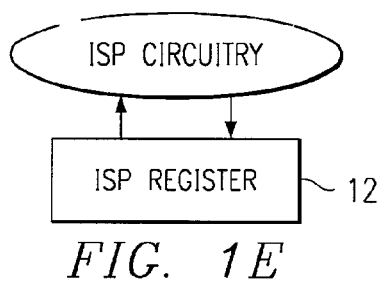
Figure 1F:
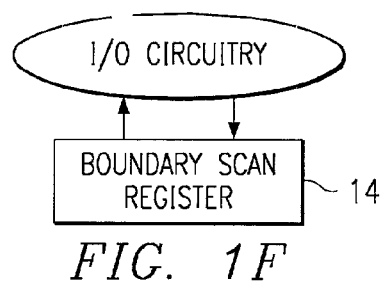
Figure 3:
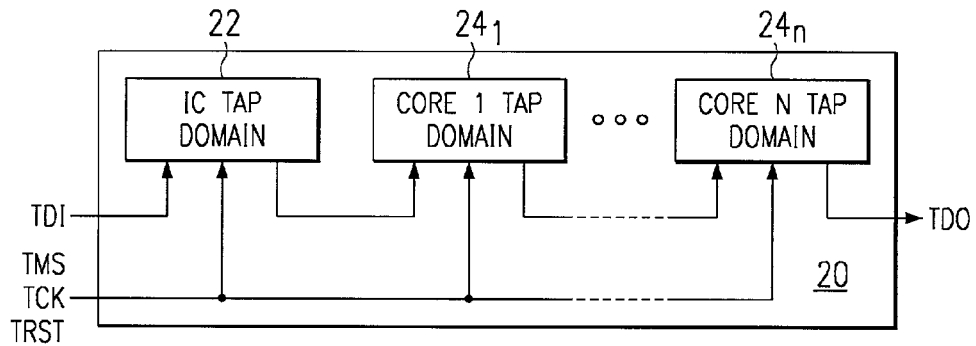
FIG. 3A illustrates an arrangement for connecting multiple TAP domains within an IC.
Figure 8A:
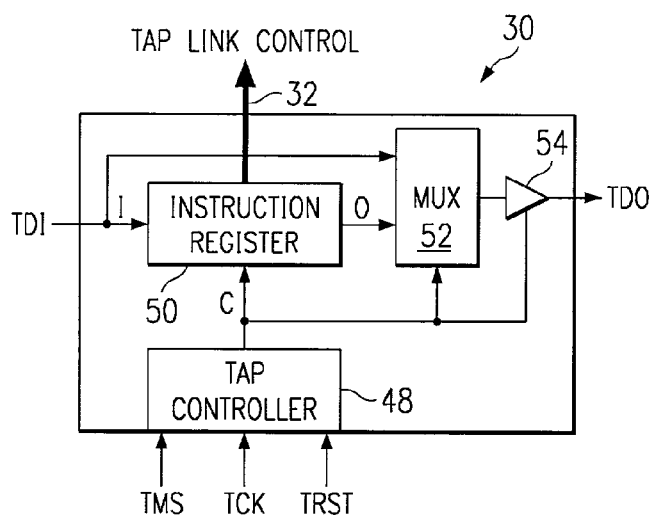
FIG. 8A illustrates the structure of the TLM.

FIG. 8A illustrates in detail the structure of the TLM 30. The TLM 30 consists of a TAP controller 48, instruction register 50, multiplexer 52, and 3-state TDO output buffer 54. The TAP controller 48 is connected to the TMS, TCK and TRST signals. The TDI input is connected to the serial input (I) of the instruction register 50 and to a first input of the multiplexer 52. The serial output (O) of the instruction register 50 is connected to the second input of the multiplexer 52. The parallel output of the instruction register 50 is connected to the TAP link control bus 32 of FIG. 4. The output of the multiplexer 52 is connected to the input of the 3-state buffer 54. The output of the 3-state buffer 54 is connected to the IC TDO output pin. The TAP controller 48 outputs control (C) to the instruction register 50, multiplexer 52, and 3-state TDO output buffer 54. The TAP controller 48 responds to TMS and TCK input as previously described in regard to FIGS. 1A and 2. During instruction scan operations, the TAP controller 48 enables the 3-state TDO buffer 54 and shifts data through the instruction register 50 from TDI to TDO. During data scan operations, the TAP controller 48 enables the 3-state TDO buffer 54 and forms a connection, via the multiplexer 52, between TDI and TDO.

Figure 8B:
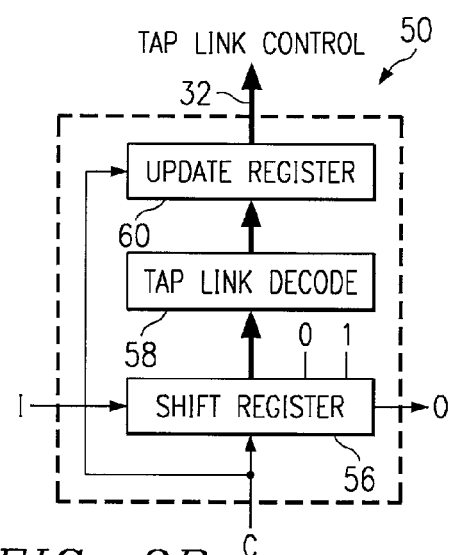
FIG. 8B illustrates the structure of the instruction register.

FIG. 8B illustrates the instruction register 50 in more detail. The instruction register 50 consists of a shift register 56, TAP link decode logic 58, and update register 60. The shift register 56 has a serial input (I), a serial output (O), a control (C) inputs, a parallel output, and a parallel input. The parallel input is provided for capturing fixed logic 0 and 1 data bits into the first two bit positions shifted out on TDO during instruction scan operations, which is a requirement of the IEEE 1149.1 standard. The parallel output from the instruction register is input to TAP link decode logic 58. The parallel output from the TAP link decode logic 58 is input to the update register 60. The parallel output of the update register 60 is the TAP link control bus input to the input and output linking circuitry. During the Capture-IR state of FIG. 2, the shift register 56 captures data (0 & 1) on the parallel input, During the Shift-IR state of FIG. 2, the shift register 56 shifts data from TDI (I) to TDO (O). During the Update-IR state of FIG. 2, the update register 60 loads the parallel input from the TAP link decode logic 58 and outputs the loaded data onto the TAP link control bus 32.

Figure 9:
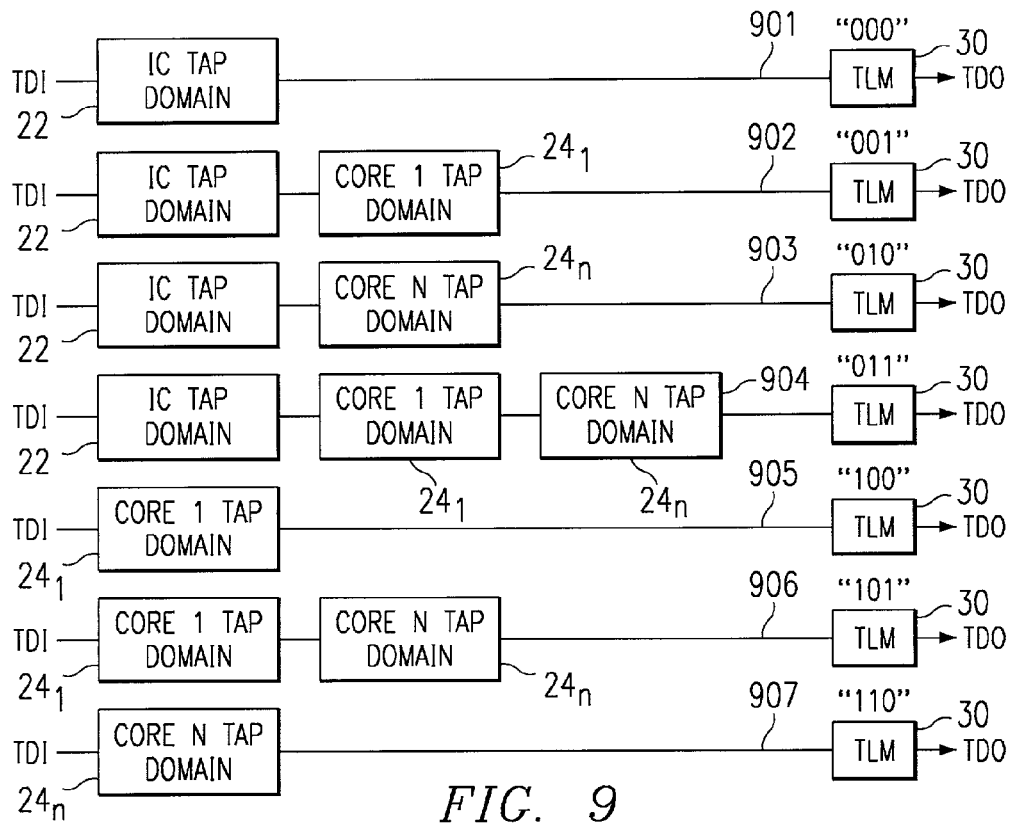
FIG. 9 illustrates various arrangements of TAP domain connections during 1149.1 instruction scan operations using the present invention.

FIG. 9 illustrates various possible arrangements 901–907 of TAP domain connections during 1149.1 instruction scan operations using the present invention. Since during instruction scan operations, the TLM's instruction register is physically present and in series with the connected TAP domain(s) instruction register(s), the instruction scan frame for each arrangement will be augmented to include the TLM's instruction register bits. The concept of augmenting the length of TAP domain instruction registers with a TLM's instruction register is disclosed in pending patent application Ser. No. 09/277,504, filed Mar. 26, 1999. It is assumed at this point that the TLM's instruction shift register 56 of FIG. 8B is 3 bits long and that the 3 bit instructions have been decoded by the TAP link decode logic 58 of FIG. 8B to uniquely select a different TAP domain connection arrangement between the ICs TDI and TDO pins. For example and as indicated in FIG. 9, shifting in the following 3 bit TLM instructions and updating them from the TLM to be input to the input and output linking circuitry will cause the following TAP domain connections to be formed.

As seen in arrangement 901, a "000" instruction shifted into and updated from the TLM instruction register 50 will cause the IC TAP domain 22 to be enabled and connected in series with the TLM 30 between the TDI and TDO IC pins.

As seen in arrangement 902, a "001" instruction shifted into and updated from the TLM instruction register 50 will cause the IC TAP domain 22 and the Core 1 TAP Domain 24$_1$ to be enabled and connected in series with the TLM 30 between the TDI and TDO IC pins.

As seen in arrangement 903, a "010" instruction shifted into and updated from the TLM instruction register 50 will cause the IC TAP domain 22 and the Core N TAP domain 24$_n$ to be enabled and connected in series with the TLM 30 between the TDI and TDO IC pins.

As seen in arrangement 904, a "011" instruction shifted into and updated from the TLM instruction register 50 will cause the IC TAP domain 22, the Core 1 TAP Domain 24$_1$, and the Core N Tap domain 24$_n$ to be enabled and connected in series with the TLM 30 between the TDI and TDO IC pins.

As seen in arrangement 905, a "100" instruction shifted into and updated from the TLM instruction register 50 will cause the Core 1 TAP Domain 24$_1$ to be enabled and connected in series with the TLM 30 between the TDI and TDO IC pins.

As seen in arrangement 906, a "101" instruction shifted into and updated from the TLM instruction register 50 will cause the Core 1 TAP Domain 24$_1$ and Core N TAP domain 24$_n$ to be enabled and connected in series with the TLM 30 between the TDI and TDO IC pins.

As seen in arrangement 907, a "110" instruction shifted into and updated from the TLM instruction register 50 will cause the Core N TAP Domain 24$_n$ to be enabled and connected in series with the TLM 30 between the TDI and TDO IC pins.

At power up of the IC, the TLM 3-bit instruction shall be initialized to "000" to allow the IC TAP domain arrangement 901 to be enabled and coupled between TDI and TDO. This complies with the IC power up requirement established in the IEEE 1149.1 standard. The process of powering up a multiple TAP domain IC to where only the IC TAP domain is enabled and selected between the IC's TDI and TDO pins is disclosed in application Ser. No. 08/918,872, filed Aug. 26, 1999, now U.S. Pat. No. 6,073,254. Following power up, an instruction scan operation can be performed to shift instruction data through the IC TAP domain and the serially connected TLM to load a new IC TAP domain instruction and to load a new 3 bit instruction into the TLM. If the power up IC TAP domain arrangement 901 is to remain in effect between TDI and TDO, the 3 bit "000" TLM instruction of FIG. 9 will be re-loaded into the TLM instruction register during the above mentioned instruction scan operation. However, if a new TAP domain arrangement is to desired between TDI and TDO, a different 3 bit TLM instruction will be loaded into the TLM instruction register during the above mentioned instruction register scan operation.

From the description given above, it is clear that a different TAP domain arrangement may be selected by the TLM's instruction register following each 1149.1 instruction scan operation, more specifically during the Update-IR state (FIG. 2) of each instruction scan operation. The TAP domain selection process of the present invention differs from the previous TAP domain selection process described in referenced pending patent application Ser. No. 09/277,504, filed Mar. 26, 1999, in the following way. The TAP domain selection process disclosed in application Ser. No. 09/277,504, filed Mar. 26, 1999, comprised the steps of: (1) performing an instruction scan to load a instruction (referred to as a code in application Ser. No. 09/277,504, filed Mar. 26, 1999) into a TLM resident instruction register (referred to as instruction augmentation bits in application Ser. No. 09/277,504, filed Mar. 26, 1999), then (2) performing a data scan operation to a TLM resident data register (referred to as a link update register in application Ser. No. 09/277,504, filed Mar. 26, 1999), selected by the instruction, to input a new TAP domain arrangement. The TAP domain selection process disclosed in the present invention comprises only the single step of: (1) performing an instruction scan to load a new TAP domain arrangement instruction into the instruction register of the FIG. 8A TLM. Thus the improvement of the present invention is seen to be the reduction of the two step TAP domain selection process described in application Ser. No. 09/277,504, filed Mar. 26, 1999, to the single TAP domain selection process described herein.

The following briefly re-visits and summarizes the operation of the TLM and input and output linking circuitry to clarify the TAP domain arrangement switching illustrated in FIG. 9. As previously described in regard to FIG. 4, the TMS inputs of enabled TAP domains are coupled to the IC's TMS input pin (via the gating circuitry of FIG. 5), while the TMS inputs of disabled TAP domains are gated to a logic low (via the gating circuitry of FIG. 5). Also, enabled TAP domains are serially connected (via the multiplexers of FIGS. 6 and 7) to form the desired serial TAP domain connection between the IC's TDI and TDO pins, the connection including the TLM. All the control for enabling or disabling the TAP domain TMS inputs and for forming serial TAP domain connections between the IC's TDI and TDO pins comes from the TLM's TAP link control bus. The control output from the TAP link control bus changes state during the Update-IR state of the TAP state diagram of FIG. 2. So, all TAP domain connection arrangement changes take place during the Update-IR state. In referenced patent applications Ser. No. 08/918,872, filed Aug. 26, 1999, now U.S. Pat. No. 6,073,254 and application Ser. No. 091277,504, filed Mar. 26, 1999, all TAP domain connection arrangement changes take place during the Update-DR state, since data scan operations are used to load a new TAP domain connection in the link update registers.

Figure 10:
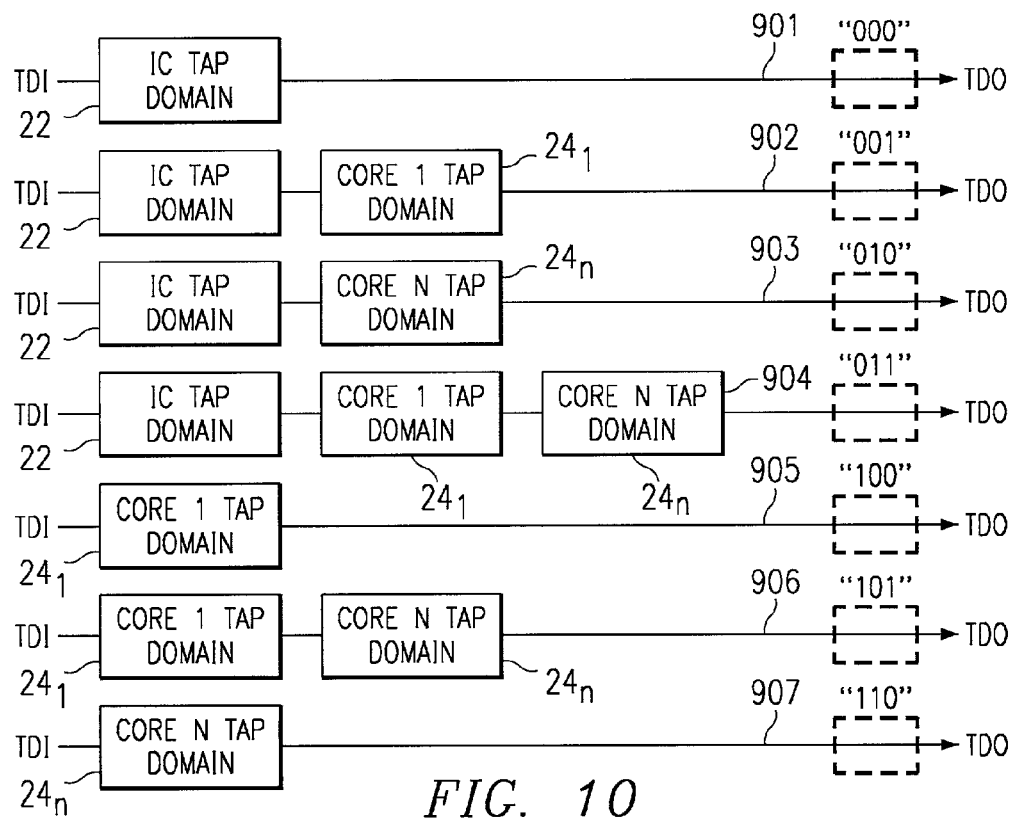
FIG. 10 illustrates that during 1149.1 data scan operations the TLM is configured, as described in regard to FIG. 8A, to simply form a connection path between the output of the selected TAP domain arrangement and the IC's TDO pin.

FIG. 10 is provided to illustrate that during 1149.1 data scan operations the TLM is configured, as described in regard to FIG. 8A, to simply form a connection path between the output of the selected TAP domain arrangement 901–907 and the IC's TDO pin. Thus the TLM does not add bits to 1149.1 data scan operations as it does for 1149.1 instruction scan operations. The forming of a connection path through the TLM during data scan operations is disclosed in the referenced pending patent application Ser. No. 09/277,504, filed Mar. 26, 1999.

It should be understood that while FIGS. 4–10 and accompanying descriptions have depicted the present invention as it would be applied and used to select TAP domains within an IC, the present invention can also be similarly applied and used to select TAP domains within individual IP core sub-circuits embedded within ICs as well. If applied and used within an IP core, the structure of the present invention remains the same. The only difference when using the FIG. 4 structure of the present invention in IP cores is that the TDI, TMS, TCK, and TRST input signals to the structure and the TDO output signal from the structure would be coupled to core terminals instead of IC pins.

The invention claimed is:

1. A process of selecting different 1149.1 TAP domain arrangements within an integrated circuit comprising:
   A. performing an 1149.1 instruction shift operation through a first 1149.1 TAP domain arrangement;
   B. performing an 1149.1 instruction update operation at the end of the 1149.1 instruction shift operation; and
   C. in response to said 1149.1 instruction update operation, selecting a second 1149.1 TAP domain arrangement that differs from the first 1149.1 TAP domain arrangement.

2. The process of claim 1 including performing the 1149.1 instruction shift operation in accordance with the 1149.1 IEEE Standard titled Test Access Port and Boundary-Scan Architecture.

3. The process of claim 1 including performing the 1149.1 instruction update operation in accordance with the 1149.1 IEEE Standard titled Test Access Port and Boundary-Scan Architecture.

4. The process of claim 1 including performing a select DR operation, a select IR operation, and a capture IR operation before performing the instruction shift operation.

5. The process of claim 1 including performing one of a select DR operation and a Run Test/Idle operation after performing the instruction update operation.

* * * * *